United States Patent
Zhang et al.

(10) Patent No.: US 9,528,181 B2
(45) Date of Patent: Dec. 27, 2016

(54) SPUTTERING TARGET AND METHOD FOR PRODUCING SAME

(75) Inventors: Shoubin Zhang, Sanda (JP); Masahiro Shoji, Sanda (JP)

(73) Assignees: MITSUBISHI MATERIALS CORPORATION, Tokyo (JP); SOLAR FRONTIER K.K., Tokyo (JP)

(*) Notice: Subject to any disclaimer, the term of this patent is extended or adjusted under 35 U.S.C. 154(b) by 515 days.

(21) Appl. No.: 14/111,504

(22) PCT Filed: Apr. 20, 2012

(86) PCT No.: PCT/JP2012/061301
§ 371 (c)(1),
(2), (4) Date: Oct. 11, 2013

(87) PCT Pub. No.: WO2012/144655
PCT Pub. Date: Oct. 26, 2012

(65) Prior Publication Data
US 2014/0048414 A1   Feb. 20, 2014

(30) Foreign Application Priority Data
Apr. 22, 2011   (JP) .................................. 2011-096591

(51) Int. Cl.
C22C 9/00   (2006.01)
C22F 1/08   (2006.01)
(Continued)

(52) U.S. Cl.
CPC ............. *C23C 14/3407* (2013.01); *B22F 3/14* (2013.01); *C22C 1/0425* (2013.01);
(Continued)

(58) Field of Classification Search
CPC ............. C23C 14/3407; C23C 14/3414; C22C 9/00–9/10; C22C 1/0425; C22F 1/08
(Continued)

(56) References Cited

U.S. PATENT DOCUMENTS 7,803,209 B2   9/2010  Takahashi
2010/0307914 A1  12/2010  Hiramoto et al.
(Continued)

FOREIGN PATENT DOCUMENTS

CN   10108947 A   11/2007
CN   101906552    12/2010
(Continued)

OTHER PUBLICATIONS

Klar, E. "Powder Metallurgy." Metals Handbook Desk Edition. ASM International, 1998. 876-91.*
(Continued)

*Primary Examiner* — Jessee R. Roe
*Assistant Examiner* — Anthony Liang
(74) *Attorney, Agent, or Firm* — Leason Ellis LLP

(57) ABSTRACT

Provided are a sputtering target which has excellent machinability and is capable of forming a compound film that mainly contains Cu and Ga and a method for producing the sputtering target. The sputtering target of the present invention has a component composition that contains 20 to 40 at % of Ga, 0.1 to 3 at % of Sb, and the balance composed of Cu and unavoidable impurities. A method for producing the sputtering target includes a step of producing a starting material powder that is obtained by pulverizing at least Cu, Ga and Sb as simple substances or an alloy that contains two or more of these elements; and a step of subjecting the starting material powder to hot processing in a vacuum, in an inert atmosphere or in a reducing atmosphere, wherein Ga is contained in the starting material powder in the form of a Cu—Ga alloy or in the form of a Ga—Sb alloy.

6 Claims, 3 Drawing Sheets

(51) Int. Cl.
    *C23C 14/34*     (2006.01)
    *B22F 3/14*     (2006.01)
    *C22C 1/04*     (2006.01)
    *C22C 28/00*     (2006.01)

(52) U.S. Cl.
    CPC .............. *C22C 1/0483* (2013.01); *C22C 9/00* (2013.01); *C22C 28/00* (2013.01); *C23C 14/3414* (2013.01)

(58) Field of Classification Search
    USPC ....... 204/298.13; 420/469–500; 75/245–247; 148/432; 106/1.05–1.29
    See application file for complete search history.

(56) References Cited

U.S. PATENT DOCUMENTS

2012/0045360 A1    2/2012   Matsumura et al.
2012/0217157 A1*   8/2012   Zhang .................. C22C 1/0425 204/298.13

FOREIGN PATENT DOCUMENTS

| | | |
|---|---|---|
| GB | 1157652 A | 7/1969 |
| JP | 2002064062 A | 2/2002 |
| JP | 2006351142 A | 12/2006 |
| JP | 2010116580 A | 5/2010 |
| JP | 2010265544 A | 11/2010 |
| JP | 2010280944 A | 12/2010 |
| JP | WO 2011055537 A1 * 5/2011 ........... C22C 1/0425 |
| TW | 200927967 A | 7/2009 |
| WO | WO-2005005683 A1 | 1/2005 |
| WO | WO-2008134516 A2 | 11/2008 |

OTHER PUBLICATIONS

International Search Report of PCT/JP2012/061301.
Office Action of TW101114153.
Extended European Search Report for EP12774193 dated Aug. 28, 2014.
Chinese Office Action dated Sep. 24, 2014 for Chinese Patent Application No. 201280003518X.

* cited by examiner

SPUTTERING TARGET AND METHOD FOR PRODUCING SAME

CROSS-REFERENCE TO RELATED APPLICATIONS

This application is a U.S. National stage application of PCT International Application No. PCT/JP2012/061301 filed Apr. 20, 2012, which claims the benefit of Japanese Patent Application No. 2011-096591 filed Apr. 22, 2011, the entire contents of the aforementioned applications are hereby incorporated herein by reference.

BACKGROUND OF THE INVENTION

Field of the Invention

The present invention relates to a sputtering target for use in forming a compound film that mainly contains Cu and Ga and a method for producing the same.

Description of the Related Art

Conventionally, a Cu—Ga target has been used as a material essential for producing a solar cell in which a Cu—In—Ga—Se quaternary alloy film (so-called "CICS film") is used as a light absorbing layer by a so-called selenization (Se) method. The selenization method is a method in which a Cu—Ga target is subject to sputtering of about 500 nm, a film stack subject to sputtering of about 500 nm consisting of the Cu—Ga target and an In film formed thereon is subject to heat treatment in an $H_2Se$ gas at a temperature of 500° C., and then Se is diffused into CuGaIn to thereby form a Cu—In—Ga—Se compound film (see Patent Document 1).

On the other hand, in order to improve the power generation efficiency of a light absorbing layer consisting of a Cu—In—Ga—Se quaternary alloy film, the addition of Na to the light absorbing layer is required. For example, Non-Patent Document 1 proposes the fact that Na content in a precursor film (Cu—In—Ga—Se quaternary alloy film) is typically about 0.1%.

PRIOR ART DOCUMENTS

Patent Document

[Patent Document 1] Japanese Patent No. 3249408

Non-Patent Document

[Non-Patent Document 1] A. Romeo, "Development of Thin-film Cu(In, Ga)Se2 and CdTe Solar Cells", Prog. Photovolt: Res. Appl. 2004; 12:93-111 (DOT: 10.1002/pip. 527)

SUMMARY OF THE INVENTION

Problems to be Solved by the Invention

The following problems still remain in the conventional techniques described above.

Specifically, since a high-Ga content Cu—Ga target with high density is very hard and exhibits poor ductility, it is difficult to subject the Cu—Ga target to surface processing by cutting, so that grinding must undesirably be used. Thus, a target processing speed is slow and it is difficult to process the Cu—Ga target to a complex shape. A Na-doped Cu—Ga target also has the same problems as described above.

The present invention has been made in view of the aforementioned circumstances, and an object of the present invention is to provide a sputtering target which has excellent machinability and is capable of forming a compound film that mainly contains Cu and Ga and a method for producing the same.

Means for Solving the Problems

The present inventors have studied the method for producing a sputtering target for a compound film that mainly contains Cu and Ga. Consequently, the present inventors have found that the machinability of the sputtering target can improve with small addition of Sb.

Thus, the present invention has been made on the basis of the finding, and adopts the following configuration in order to overcome the aforementioned problems. Specifically, a sputtering target according to a first aspect of the present invention is characterized in that the sputtering target has a component composition containing 20 to 40 at % of Ga, 0.1 to 3 at % of Sb, and the balance composed of Cu and unavoidable impurities.

Since the sputtering target according to the first aspect of the present invention contains 0.1 to 3 at % of Sb, the sputtering target can have high machinability even if the sputtering target is produced with high density.

The reason why the amount of Sb added is set within the above range is because, if the amount of Sb added is less than 0.1 at %, the machinability improving effect of the sputtering target cannot be obtained and whereas if the amount of Sb added exceeds 3 at %, the sputtering target is susceptible to embrittlement, resulting in the readily occurrence of cracking or chipping during cutting processing.

A sputtering target according to a second aspect of the present invention is characterized in that the sputtering target according to the first aspect of the present invention has a structure including at least one of a Sb simple substance or a compound including Sb and Cu within crystal grains or grain boundaries of an alloy phase mainly containing a Cu—Ga alloy.

Specifically, since the sputtering target according to the second aspect of the present invention has a structure including at least one of a Sb simple substance or a compound including Sb and Cu within crystal grains or grain boundaries (hereinafter, may be abbreviated as "grain boundaries or the like") of an alloy phase mainly containing a Cu—Ga alloy, free-machinability can be imparted to the sputtering target by the presence of a Sb simple substance or a compound including Sb and Cu within grain boundaries or the like, resulting in an improvement in machinability.

A sputtering target according to a third aspect of the present invention is characterized in that Ga in the sputtering target material is contained in the form of a Cu—Ga binary alloy according to the first or the second aspect of the present invention.

The present inventors have found that, when Sb is added, the presence of Ga simple substance in the sputtering target material affects the machinability of the sputtering target. Specifically, the present inventors have found that, if a Ga simple substance is contained in the sputtering target, cracking or chipping may easily occur in the Sb-containing Cu—Ga sputtering target during machine processing after sintering.

In order to overcome such circumstances, the sputtering target of the present invention is characterized in that Ga in the sputtering target material is contained in the form of a Cu—Ga binary alloy. Specifically, Ga is contained in the form of a Cu—Ga solid solution or an intermetallic compound, so that a working surface suitable for sputtering can be realized without the occurrence of chipping or cracking during cutting processing after sintering.

Also, Ga in the sputtering target is contained in the form of a Cu—Ga alloy and partially in the form of a Ga—Sb alloy.

A sputtering target according to a fourth aspect of the present invention is characterized in that Na is contained as an NaF compound, an $Na_2S$ compound, or an $Na_2Se$ compound and Na is contained in 0.05 to 2 at % with respect to all metal elements in the sputtering target according to the first to third aspects of the present invention.

Specifically, since, in the fourth aspect of the present invention, Na is contained as an NaF compound, an $Na_2S$ compound, or an $Na_2Se$ compound and Na is contained in 0.05 to 2 at % with respect to all metal elements in the sputtering target, a Cu—Ga film containing Na which is effective for the improvement in power generation efficiency may be formed. It should be noted that fluorine (F) and sulfur (S) entrapped in a Cu—Ga film containing Na do not particularly affect the characteristics of the light absorbing layer of a solar cell.

Here, the reason why the Na content is set within the above range is as follows. If the amount of Na added exceeds 2 at %, the adhesion between a Cu—Ga—Na film and an Mo electrode serving as a base layer becomes significantly weak, resulting in the occurrence of film separations during a subsequent selenization process. On the other hand, if the amount of Na added is less than 0.05 at %, the effect of improving power generation efficiency may not be obtained. It should be noted that the Na content in the Cu—Ga sputtering target is preferably in the range of 0.1 at % to 0.5 at %.

A method for producing a sputtering target according to a fifth aspect of the present invention is a method for producing the sputtering target according to any one of the first to fourth aspects of the present invention and is characterized in that the method includes a step of producing a starting material powder that is obtained by pulverizing at least Cu, Ga and Sb as simple substances or an alloy that contains two or more of these elements; and a step of subjecting the starting material powder to hot processing in a vacuum, in an inert atmosphere or in a reducing atmosphere, wherein Ga is contained in the starting material powder in the form of a Cu—Ga alloy or in the form of a Ga—Sb alloy.

Specifically, since, in the fifth aspect of the present invention, Ga is contained in the starting material powder in the form of a Cu—Ga alloy or in the form of a Ga—Sb alloy, Ga in a sintered body structure can surely be alloyed as compared with a case where only metal Ga is contained in the starting material powder, resulting in an improvement in cutting processability of a sintered body consisting of Cu, Ga, and Sb.

A method for producing a sputtering target according to a sixth aspect of the present invention is a method for producing the sputtering target according to the fourth aspect of the present invention and is characterized in that the method includes a step of producing a starting material powder that is obtained by preparing at least Cu, Ga and Sb as simple substances or an alloy that contains two or more of these elements as metal powder and mixing the metal powder with NaF powder, $Na_2S$ powder, or $Na_2Se$ powder; and a step of subjecting the starting material powder to hot processing in a vacuum, in an inert atmosphere or in a reducing atmosphere, wherein Ga is contained in the starting material powder in the form of a Cu—Ga alloy or in the form of a Ga—Sb alloy.

Specifically, since, in the sixth aspect of the present invention, Ga is contained in the starting material powder in the form of a Cu—Ga alloy or in the form of a Ga—Sb alloy, Ga in a sintered body structure can surely be alloyed as compared with a case where only metal Ga is contained in the starting material powder, resulting in an improvement in cutting processability of a sintered body consisting of Cu, Ga, and Sb.

Effects of the Invention

According to the present invention, the following effects may be provided.

Specifically, according to the sputtering target of the present invention and the method for producing the same, the sputtering target contains 0.1 to 3 at % of Sb, and thus, the sputtering target can have high machinability even if the sputtering target is produced with high density. Thus, in the sputtering target of the present invention, it becomes easy to subject the sputtering target to surface processing by cutting, so that a sputtering target processing speed is fast and it also becomes easy to process the sputtering target to a complex shape. Also, an Sb-containing Cu—Ga film can be formed by using the sputtering target of the present invention by the sputtering method.

DESCRIPTION OF THE EMBODIMENTS

Figure 1:
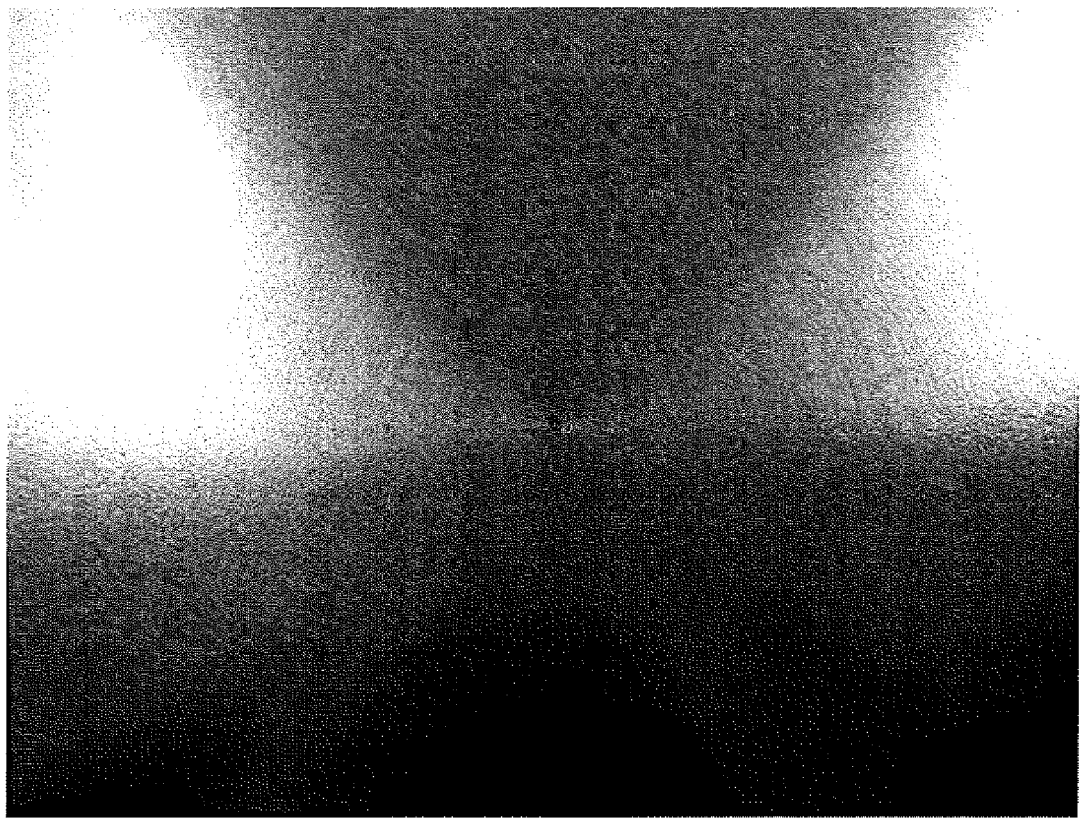
FIG. 1 is a photograph illustrating the processed target surface in Example of the sputtering target and the method for producing the same according to the present invention.

Hereinafter, a description will be given of one embodiment of the sputtering target of the present invention and a method for producing the same.

The sputtering target of the present embodiment has a component composition containing 20 to 40 at % of Ga, 0.1 to 3 at % of Sb, and the balance composed of Cu and unavoidable impurities with respect to all metal elements in the sputtering target.

Also, the sputtering target of the present embodiment has a structure including a Sb simple substance or a compound including Sb and Cu within crystal grains or grain boundaries of an alloy phase mainly containing a Cu—Ga alloy. Furthermore, it is preferable that, in the Sb simple substance or the compound including Sb and Cu, the number of particles having a grain diameter (inscribed circle-equivalent diameter) of 0.5 µm or greater in the area of 200 µm×150 µm is three or greater. Note that a Sb simple substance or a compound including Sb and Cu and its grain diameter dispersed within crystal grains or grain boundaries of an alloy phase mainly containing a Cu—Ga alloy can be measured by Cu, Ga, and Sb element mapping images using, for example, an electron-probe micro analyzer (EPMA).

Furthermore, in the sputtering target of the present embodiment, Ga in the sputtering target material is contained in the form of a Cu—Ga binary alloy.

Specifically, Ga is not present in the sputtering target material as a simple substance, resulting in an improvement in machinability of the sputtering target. The presence/absence of a Ga simple substance and the presence/absence of a Cu—Ga alloy can be determined by, for example, X-ray diffraction (XRD) measurement of the sputtering target. Specifically, after polishing of the surfaces of these sputtering targets (Ra: 5 µm or less), XRD measurement is performed, so that the presence of a Ga simple substance can be determined by peaks at around 0 of 15.24° (orientation: 111), 22.77° (113), and 23.27° (202) belonging to the Ga simple substance. The presence/absence of a Cu—Ga alloy can be determined by a standard diffraction curve card using XRD measurement by the same method as in the above-described method. Examples of a method for forming a Ga alloy in the sputtering target material include a method for adding Ga which is the starting material for the sputtering target to a starting material powder as a Cu—Ga alloy or a Cu—Ga intermetallic compound or as a Ga—Sb alloy or a Ga—Sb intermetallic compound, a method for forming an alloy by melting the starting materials Cu, Ga, and Sb together, and the like.

It should be noted that, in the sputtering target of the present embodiment, Na may be contained as an NaF compound, an $Na_2S$ compound, or an $Na_2Se$ compound and Na may be contained in 0.05 to 2 at % with respect to all metal elements in the sputtering target.

For composition evaluation of the metal elements, quantitative analysis is carried out using an ICP method (high frequency induction coupled plasma method) by pulverizing the sputtering target.

The method for producing the sputtering target of the present embodiment includes a step of producing a starting material powder that is obtained by pulverizing at least Cu, Ga and Sb as simple substances or an alloy that contains two or more of these elements; a step of subjecting the starting material powder to hot processing such as sintering by hot pressing (HP) or hot isostatic pressing (HIP) in a vacuum, in an inert gas atmosphere or in a reducing atmosphere or a step of subjecting the produced starting material powder to hot processing such as sintering in an unpressurized state such as in a vacuum, in an inert gas atmosphere at a pressure of from 0.01 $kgf/cm^2$ to 10 $kgf/cm^2$, or in a reducing atmosphere after pressure molding of the produced starting material powder. It is preferable that Ga is contained in the starting material powder in the form of a Cu—Ga alloy or in the form of a Ga—Sb alloy.

It is preferable that sintering using the hot pressing method is performed at a hot pressing temperature (retention temperature during hot pressing) in the range of from 500° C. to 650° C. The reason why a hot pressing temperature is set within the above range is as follows. If the hot pressing temperature is less than 500° C., the density of the sintered body becomes low, and thus, chipping may easily occur on the sintered body during cutting processing. On the other hand, if the hot pressing temperature exceeds 650° C., Sb is eluted during hot pressing, resulting in a cause of composition deviance in the sintered body. Although the melting point of a metal Sb is around a temperature of 630° C., the amount of Sb added in this application does not cause the elution of Sb during hot pressing at a hot pressing temperature of 650° C. or less according to the results of research by the present inventors.

It is preferable that sintering using the HIP method is performed at a HIP temperature (retention temperature during HIP pressing) in the range of from 400° C. to 620° C. The reason why an HIP temperature is set within the above range is as follows. If the HIP temperature is less than 400° C., the density of the sintered body becomes low, and thus, chipping may easily occur on the sintered body during cutting processing. On the other hand, if the HIP temperature exceeds 620° C., Sb is eluted during HIP, resulting in a cause of composition deviance in the sintered body.

It is preferable that sintering using a method for sintering the resulting molded object in vacuum, in an inert atmosphere, or in a reducing atmosphere after pressure molding of the starting material powder is performed at a sintering temperature (sintering temperature during sintering) in the range of from 550° C. to 650° C. The reason why a sintering temperature is set within the above range is as follows. If the sintering temperature is less than 550° C., the density of the sintered body becomes low, and thus, chipping may easily occur on the sintered body during cutting processing. On the other hand, if the sintering temperature exceeds 650° C., Sb is eluted during hot pressing, resulting in a cause of composition deviance in the sintered body. Although the melting point of a metal Sb is around a temperature of 630° C., the amount of Sb added in this application does not cause the elution of Sb during sintering using the method at a sintering temperature of 650° C. or less according to the results of research by the present inventors.

A starting material powder for use in hot processing is produced by any one of the following methods (a) to (d).

(a) A predetermined total amount of Cu—Ga—Sb is atomized by an atomizing device so as to produce a Cu—Ga—Sb atomized powder as a starting material powder. Note that, when Na is added, a predetermined amount of NaF powder, $Na_2S$ powder, or $Na_2Se$ powder is mixed with the starting material powder.

(b) A predetermined total amount of CuGa is atomized by an atomizing device so as to produce Cu—Ga atomized powder. Then, Sb powder is mixed with the Cu—Ga atomized powder so as to obtain a starting material powder having a predetermined composition. Note that, when Na is added, a predetermined amount of NaF powder, $Na_2S$ powder, or $Na_2Se$ powder is mixed with the starting material powder.

(c) A Cu—Ga—Sb atomized powder is produced by an atomizing device. Then, CuGa powder, Cu powder, or Sb powder is added to the Cu—Ga—Sb atomized powder so as to obtain a powder mixture having a predetermined composition. Note that, when Na is added, a predetermined amount of NaF powder, $Na_2S$ powder, or $Na_2Se$ powder is mixed with the starting material powder.

(d) A predetermined total amount of Cu—Ga—Sb is melted and casted to obtain an ingot. Then, the resulting ingot is pulverized to thereby obtain powder which is used as the starting material powder. Note that, when Na is added, a predetermined amount of NaF powder, $Na_2S$ powder, or $Na_2Se$ powder is mixed with the starting material powder.

Next, the starting material powder produced by any one of the methods (a) to (d) is subject to hot processing by a method such as hot pressing, HIP (hot isostatic pressing), or sintering a molded object after pressure molding of the starting material powder. Also, in order to prevent oxidization of a Cu—Ga alloy or Cu, such hot processing is carried out in a vacuum, in an inert gas atmosphere, or in a reducing gas atmosphere. The pressure applied during hot pressing or HIP may greatly affect the density of the sputtering target sintered body, and thus, the pressure to be applied during hot pressing is preferably in the range of from 100 kgf/cm$^2$ to 500 kgf/cm$^2$. The pressure to be applied during HIP is preferably in the range of from 500 kgf/cm$^2$ to 1500 kgf/cm$^2$. Also, pressurization may be performed prior to the start of the elevation of temperature for sintering or may be applied after a certain temperature is reached.

Next, since a Sb-containing Cu—Ga sintered body (or Sb and Na-containing Cu—Ga sintered body) sintered by the hot processing exhibits excellent machinability, the Sb-containing Cu—Ga sintered body is processed into a specified shape of a sputtering target using cutting processing. Next, the processed sputtering target is bonded to a backing plate consisting of Cu or Cu alloy using In as a solder, and the resulting target is provided to sputtering.

In order to prevent oxidization and moisture absorption of the processed sputtering target from being occurred, the entire sputtering target is preferably stored in a vacuum pack or a pack purged with inert gas.

The thus produced sputtering target of the present embodiment is subject to sputtering in Ar gas by a direct-current (DC) magnetron sputtering method. For the direct-current sputtering, a pulse superimposing power supply for applying a pulse voltage or a non-pulse DC power supply may also be employed.

As described above, according to the sputtering target of the present embodiment, the sputtering target contains 0.1 to 3 at % of Sb, and thus, the sputtering target can have high machinability even if the sputtering target is produced with high density. In particular, since the sputtering target has a structure including a Sb simple substance or a compound including Sb and Cu within crystal grains or grain boundaries of an alloy phase mainly containing a Cu—Ga alloy, the bonding strength between crystal grains becomes low by the presence of a Sb simple substance or a compound including Sb and Cu within grain boundaries or the like, resulting in an improvement in machinability.

Ga in the sputtering target material is contained in the form of a Cu—Ga binary alloy. Specifically, Ga is contained in the form of a Cu—Ga solid solution or an intermetallic compound, so that a working surface suitable for sputtering can be realized without the occurrence of chipping or cracking during cutting processing after sintering. Also, Ga in the sputtering target is contained in the form of a Cu—Ga alloy and partially in the form of a Ga—Sb alloy.

Also, when Na is contained as an NaF compound, an Na$_2$S compound, or an Na$_2$Se compound and Na is contained in 0.05 to 2 at % with respect to all metal elements in the sputtering target, a Cu—Ga film containing Na which is effective for the improvement in power generation efficiency may be formed by the sputtering method. It should be noted that fluorine (F) and sulfur (S) entrapped in a Cu—Ga film containing Na do not particularly affect the characteristics of the light absorbing layer of a solar cell.

Furthermore, since Ga is contained in the starting material powder in the form of a Cu—Ga alloy or in the form of a Ga—Sb alloy in the method for producing the sputtering target of the present embodiment, cutting processability of the sputtering target improves as compared with a case where only metal Ga is contained in the starting material powder.

[Examples]

Next, the sputtering target of the present invention and a method for producing the same will be specifically described with reference to the evaluation result of the actually produced sputtering target by way of Examples, based on the aforementioned embodiment.

(Production of Starting Material Powder)

Firstly, as the starting material powder in Examples 1 to 6, the total amount of Cu, Sb, and Ga metals was loaded into an atomizing device and was heated to 1150° C. After confirming the fact that all metals became molten, the resulting molten metal was atomized by the atomizing device to thereby produce Cu—Ga—Sb atomized powder so as to obtain the composition in Table 1.

As the starting material powder in Example 7, the total amount of Sb and Ga and a half the amount of Cu were loaded into an atomizing device and were heated to 1150° C. After confirming the fact that all metals became molten, the resulting molten metal was atomized by the atomizing device to thereby produce Cu—Ga—Sb atomized powder so as to obtain the composition in Table 1. Next, Cu powder having an average grain diameter of 2 μm or less was applied on the obtained Cu—Ga—Sb atomized powder, and the resulting mixture was mixed by dry ball milling (ZrO$_2$ ball having a diameter of 5 mm, ball/metal powder weight ratio=3:1) for four hours to thereby produce a powder mixture of Cu, Ga, and Sb having a predetermined composition. Note that dry ball milling was used under the same conditions in Examples and Comparative Examples.

As the starting material powder in Example 8, the total amount of Cu, Sb, and Ga was loaded into a vacuum melting furnace and was heated to 1150° C. After confirming the fact that all metals became molten, the resulting metal molten was poured into a water-cooled casting mold to thereby produce an ingot consisting of Cu, Ga, and Sb so as to obtain the composition in Table 1. Next, the obtained Cu—Ga—Sb ingot was pulverized into a powder having an average grain diameter of 5 μm or less to thereby produce a powder mixture of Cu, Ga, and Sb having a predetermined composition.

As the starting material powder in Example 9, Cu, Ga, and Sb were firstly loaded into an atomizing device and were heated to 1150° C. After confirming the fact that all metals became molten, the resulting molten metal was atomized by the atomizing device to thereby produce Cu$_{57}$Ga$_{40}$Sb$_3$ (at %) atomized powder so as to obtain the composition of Cu$_{57}$Ga$_{40}$Sb$_3$ (at %). Next, Cu, Ga, and Sb were loaded into an atomizing device and were heated to 1150° C. After confirming the fact that all metals became molten, the resulting molten metal was atomized by the atomizing device to thereby produce Cu$_{67}$Ga$_{30}$Sb$_3$ (at %) atomized powder so as to obtain the composition of Cu$_{67}$Ga$_{30}$Sb$_3$ (at %). Furthermore, the obtained two compositions were mixed by dry ball milling for four hours to thereby produce a powder mixture of Cu, Ga, and Sb so as to obtain a predetermined composition in Table 1.

As the starting material powder in Examples 10, 11, and 12, the total amount of Cu and Ga metals was firstly loaded into an atomizing device and was heated to 1150° C. After confirming the fact that all metals became molten, the resulting molten metal was atomized by the atomizing device to thereby produce Cu—Ga atomized powder. Next, the pulverized Sb powder having an average grain diameter of 2 μm or less was applied on the obtained Cu—Ga atomized powder and the resulting mixture was mixed by dry ball milling for eight hours to thereby produce a powder mixture of Cu, Ga, and Sb in Table 1 so as to obtain the composition of Cu$_{74}$Ga$_{25.5}$Sb$_{0.5}$ (at %).

As the starting material powder in Example 13, the total amount of Cu and Ga metals was loaded into an atomizing device and was heated to 1150° C. After confirming the fact that all metals became molten, the resulting molten metal was atomized by the atomizing device to thereby produce Cu—Ga atomized powder. Next, the pulverized Sb powder having an average grain diameter of 2 μm or less and NaF powder having an average grain diameter of 1 μm or less were applied on the obtained Cu—Ga atomized powder and the resulting mixture was mixed by dry ball milling for eight hours to thereby produce a powder mixture in Table 1 so as to obtain the composition of $Cu_{68.5}Ga_{30}Sb_{0.5}Na_{0.5}F_{0.5}$ (at %).

As the starting material powder in Example 14, the total amount of Cu and Ga metals was loaded into an atomizing device and was heated to 1150° C. After confirming the fact that all metals became molten, the resulting molten metal was atomized by the atomizing device to thereby produce Cu—Ga atomized powder. Next, the pulverized Sb powder having an average grain diameter of 2 μm or less and NaF powder having an average grain diameter of 1 μm or less were applied on the obtained Cu—Ga atomized powder, and the resulting mixture was mixed by dry ball milling for eight hours to thereby produce a powder mixture in Table 1 so as to obtain the composition of $Cu_{78.5}Ga_{20}Sb_{0.5}Na_{0.5}F_{0.5}$ (at %).

As the starting material powder in Example 15, the total amount of Cu, Ga, and Sb metals was loaded into an atomizing device and was heated to 1150° C. After confirming the fact that all metals became molten, the resulting molten metal was atomized by the atomizing device to thereby produce Cu—Ga—Sb atomized powder. Next, NaF powder having an average grain diameter of 1 μm or less was applied on the obtained Cu—Ga—Sb atomized powder, and the resulting mixture was mixed by dry ball milling for eight hours to thereby produce a powder mixture in Table 1 so as to obtain the composition of $Cu_{63.5}Ga_{35}Sb_{0.5}Na_{0.5}F_{0.5}$ (at %).

As the starting material powder in Example 16, a half the amount of Cu and the total amount of Ga and Sb metals were loaded into an atomizing device and were heated to 1150° C. After confirming the fact that all metals became molten, the resulting molten metal was atomized by the atomizing device to thereby produce Cu—Ga—Sb atomized powder. Next, Cu powder having an average grain diameter of 2 μm or less and NaF powder having an average grain diameter of 1 μm or less were applied on the obtained Cu—Ga—Sb atomized powder, and the resulting mixture was mixed by dry ball milling for eight hours to thereby produce a powder mixture in Table 1 so as to obtain the composition of $Cu_{63.5}Ga_{35}Sb_{0.5}Na_{0.5}F_{0.5}$ (at %).

As the starting material powder in Example 17, the total amount of Cu, Ga, and Sb metals was loaded into an atomizing device and was heated to 1150° C. After confirming the fact that all metals became molten, the resulting molten metal was atomized by the atomizing device to thereby produce Cu—Ga—Sb atomized powder. Next, $Na_2S$ powder having an average grain diameter of 1 μm or less was applied on the obtained Cu—Ga—Sb atomized powder, and the resulting mixture was mixed by dry ball milling for four hours to thereby produce a powder mixture in Table 1 so as to obtain the composition of $Cu_{63.75}Ga_{35}Sb_{0.5}Na_{0.5}S_{0.25}$ (at %).

As the starting material powder in Example 18, the total amount of Cu, Ga, and Sb metals was loaded into an atomizing device and was heated to 1150° C. After confirming the fact that all metals became molten, the resulting molten metal was atomized by the atomizing device to thereby produce Cu—Ga—Sb atomized powder. Next, $Na_2Se$ powder having an average grain diameter of 1 μm or less was applied on the obtained Cu—Ga—Sb atomized powder, and the resulting mixture was mixed by dry ball milling for four hours to thereby produce a powder mixture in Table 1 so as to obtain the composition of $Cu_{63.75}Ga_{35}Sb_{0.5}Na_{0.5}Se_{0.25}$ (at %).

(Comparative Examples)

As the starting material powder in Comparative Example 1 of the present invention, the total amount of Cu and Ga metals was loaded into an atomizing device and was heated to 1150° C. After confirming the fact that all metals became molten, the resulting molten metal was atomized by the atomizing device to thereby produce Cu—Ga atomized powder in Table 2 so as to obtain the composition of $Cu_{75}Ga_{25}$ (at %).

As the starting material powder in Comparative Example 2 of the present invention, Cu and Ga metals were firstly loaded into an atomizing device and were heated to 1150° C. After confirming the fact that all metals became molten, the resulting molten metal was atomized by the atomizing device to thereby produce $Cu_{55}Ga_{45}$ (at %) atomized powder so as to obtain the composition of $Cu_{55}Ga_{45}$ (at %). Next, $Cu_{85}Ga_{15}$ (at %) atomized powder was produced by the same method. Furthermore, a powder mixture of $Cu_{55}Ga_{45}$ (at %) atomized powder and $Cu_{85}Ga_{15}$ (at %) atomized powder was weighed so as to obtain the composition of $Cu_{75}Ga_{25}$ (at %). Then, two types of atomized powder were mixed by dry ball milling for four hours to thereby produce a powder mixture in Table 2.

As the starting material powder in Comparative Example 3 of the present invention, Cu and Ga metals were firstly loaded into an atomizing device and were heated to 1150° C. After confirming the fact that all metals became molten, the resulting molten metal was atomized by the atomizing device to thereby produce $Cu_{55}Ga_{45}$ (at %) atomized powder so as to obtain the composition of $Cu_{55}Ga_{45}$ (at %). Next, a powder mixture of $Cu_{55}Ga_{45}$ (at %) atomized powder and pure Cu powder (average grain diameter of 2 μm) was weighed so as to obtain the composition of $Cu_{75}Ga_{25}$ (at %). Then, two types of powder were mixed by dry ball milling for four hours to thereby produce a powder mixture in Table 2.

In Comparative Example 4, the total amount of Cu and Ga metals was loaded into a vacuum melting device and was heated to 1150° C. After confirming the fact that all metals became molten, the resulting metal molten was poured into a graphite casting mold to thereby produce an ingot so as to obtain the composition of $Cu_{75}Ga_{25}$ (at %) in Table 2. The obtained ingot was further heated to 800° C. in nitrogen, was held for one hour, and then was subject to rolling in four passes in total at a reduction of 5% per pass.

As the starting material powder in Comparative Example 5, the total amount of Cu, Sb, and Ga metals was loaded into an atomizing device and was heated to 1150° C. After confirming the fact that all metals became molten, the resulting molten metal was atomized by the atomizing device to thereby produce Cu—Ga—Sb atomized powder in Table 2 so as to obtain the composition of $Cu_{69.98}Ga_{30}Sb_{0.02}$ (at %).

As the starting material powder in Comparative Example 6, the total amount of Cu and Ga metals was firstly loaded into an atomizing device and was heated to 1150° C. After confirming the fact that all metals became molten, the resulting molten metal was atomized by the atomizing device to thereby produce Cu—Ga atomized powder so as to obtain the composition of $Cu_{69.98}Ga_{30}Sb_{0.02}$ (at %). Next, the pulverized Sb powder having an average grain diameter of 2 μm or less was applied on the obtained Cu—Ga atomized powder, and the resulting mixture was mixed by dry ball milling for eight hours to thereby produce a powder mixture in Table 2.

In Comparative Example 7, the total amount of Cu, Ga, and Sb metals was loaded into a vacuum melting device and was heated to 1150° C. After confirming the fact that all metals became molten, the resulting metal molten was poured into a graphite casting mold to thereby produce an ingot so as to obtain the composition of $Cu_{69.98}Ga_{30}Sb_{0.02}$ (at %) in Table 2. The obtained ingot was further heated to 600° C. in nitrogen, was held for one hour, and then was subject to rolling in four passes in total at a reduction of 5% per pass.

As the starting material powder in Comparative Example 8, the total amount of Cu, Sb, and Ga metals was loaded into an atomizing device and was heated to 1150° C. After confirming the fact that all metals became molten, the resulting molten metal was atomized by the atomizing device to thereby produce Cu—Ga—Sb atomized powder in Table 2 so as to obtain the composition of $Cu_{60}Ga_{35}Sb_5$ (at %).

As the starting material powder in Comparative Example 9, the total amount of Cu, Ga, and Sb metals was loaded into an atomizing device and was heated to 1150° C. After confirming the fact that all metals became molten, the resulting molten metal was atomized by the atomizing device to thereby produce Cu—Ga—Sb atomized powder. Next, NaF powder having an average grain diameter of 1 μm or less was applied on the obtained Cu—Ga—Sb atomized powder, and the resulting mixture was mixed by dry ball milling for eight hours to thereby produce a powder mixture in Table 2 so as to obtain the composition of $Cu_{73}Ga_{20}Sb_5Na_{1.0}F_{1.0}$ (at %).

As the starting material powder in Comparative Example 10, the total amount of Cu and Sb metals was firstly loaded into an atomizing device and was heated to 1150° C. After confirming the fact that all metals became molten, the resulting molten metal was atomized by the atomizing device to thereby produce Cu—Sb atomized powder. At the same time, a Ga ingot was pulverized at a low temperature of 20° C. or lower and then was passed through a 0.5 mm mesh sieve to thereby produce Ga powder having a diameter of 0.5 mm or less. Next, the Ga powder was applied on the obtained Cu—Sb atomized powder, and the resulting mixture was mixed by dry ball milling for one hour at a temperature of 15° C. or lower to thereby produce a powder mixture in Table 2 so as to obtain the composition of $Cu_{61.5}Ga_{35}Sb_{3.5}$ (at %).

As the starting material powder in Comparative Example 11, the total amount of Cu, Ga, and Sb metals was firstly loaded into an atomizing device and was heated to 1150° C. After confirming the fact that all metals became molten, the resulting molten metal was atomized by the atomizing device to thereby produce Cu—Ga—Sb atomized powder. At the same time, a Ga ingot was pulverized at a low temperature of 20° C. or lower and then was passed through a 0.5 mm mesh sieve to thereby produce Ga powder having a diameter of 0.5 mm or less. Next, the pulverized Sb powder having an average grain diameter of 2 μm or less and the Ga powder were applied on the obtained Cu—Ga—Sb atomized powder, and the resulting mixture was mixed by dry ball milling for one hour at a temperature of 15° C. or lower to thereby produce a powder mixture in Table 2 so as to obtain the composition of $Cu_{66}Ga_{32}Sb_{2.0}$ (at %).

As the starting material powder in Comparative Example 12, the total amount of Cu and Ga metals was loaded into an atomizing device and was heated to 1150° C. After confirming the fact that all metals became molten, the resulting molten metal was atomized by the atomizing device to thereby produce Cu—Ga atomized powder. Next, $Na_2S$ powder having an average grain diameter of 1 μm or less was applied on the obtained Cu—Ga atomized powder, and the resulting mixture was mixed by dry ball milling for four hours to thereby produce a powder mixture in Table 2 so as to obtain the composition of $Cu_{63.5}Ga_{35}Na_{1.0}S_{0.5}$ (at %).

As the starting material powder in Comparative Example 13, the total amount of Cu and Ga metals was loaded into an atomizing device and was heated to 1150° C. After confirming the fact that all metals became molten, the resulting molten metal was atomized by the atomizing device to thereby produce Cu—Ga atomized powder. Next, $Na_2Se$ powder having an average grain diameter of 1 μm or less was applied on the obtained Cu—Ga atomized powder, and the resulting mixture was mixed by dry ball milling for four hours to thereby produce a powder mixture in Table 2 so as to obtain the composition of $Cu_{63.5}Ga_{35}Na_{1.0}Se_{0.5}$ (at %).

(Production and Evaluation of Sputtering Target)

As described above, these produced starting material powder in Examples and Comparative Examples were used to thereby produce sputtering targets each having a diameter of 200 mm and a thickness of 6 mm by using the vacuum hot pressing method, the HIP method, the atmosphere sintering method after pressure molding (a mixed gas of 20% hydrogen and 80% nitrogen of two atmosphere was used as the atmosphere during sintering), or the casting method as shown in Table 3 and Table 4. The dimension and the density of each of the obtained target were calculated and the results calculated as the theoretical density ratio were described in Table 3 and Table 4.

Furthermore, the structure observation and X-ray diffraction measurement of each target were performed and quantitative analysis for Ga content, Sb content, and Na content which are metal components contained in the target was carried out using an ICP method (high frequency induction coupled plasma method). Also, the presence/absence of chipping after processing and the surface roughness (Ra: arithmetic mean roughness, Rz: ten-point mean roughness) of each target were measured for evaluating the processability and cutting effect of the target. The results are shown in Table 5 and Table 6.

Note that the presence of a Ga simple substance in the target material was identified as a Ga simple substance using the XRD chart of the sintered targets. Specifically, after polishing of the surfaces of these sintered bodies (Ra: 5 μm or less), X-ray diffraction (XRD) was performed so that the presence of a Ga simple substance was identified by peaks at around θ of 15.24° (orientation: 111), 22.77° (113), and 23.27° (202) belonging to the Ga simple substance.

The structure observation of the sputtering targets was performed as follows. The fragment of the sintered sputtering target was embedded with a resin and was then subject to wet polishing so as to obtain a flat surface. Then, the surface distribution (MAPPING) of Cu, Ga, and Sb elements was measured by using an EPMA (electron-probe micro analyzer: manufactured by JEOL JXA-8500F). The observation conditions were as follows: an accelerating voltage of 15 kV, an irradiation current of 50 nA, a scan type of single direction, a pixel (X, Y) of (240,180), a spot size (X, Y) of (0.2 μm, 0.2 μm), and a measurement time of 10 mS. Also, element distribution (mapping) was measured several times in the area of 200×150 μm in an observation magnification of 2,000. The presence/absence of a structure (hereinafter referred to as "intervening Sb phase") including at least one of a Sb simple substance or a compound including Sb and Cu within crystal grains or grain boundaries of an alloy phase mainly containing a Cu—Ga alloy was confirmed by the obtained mapping image. Furthermore, the number of particles of the intervening Sb phase having an inscribed circle-equivalent diameter of 0.5 μm or greater was measured by using the Sb composition distribution diagram. The abovementioned results were described in Table 5 and Table 6.

The method for evaluating processability and cutting effect was performed as follows. Firstly, CuGa sintered bodies or Cu—Ga—Sb sintered bodies in Examples or Comparative Examples were subject to dry processing using a MS850G lathe manufactured by MORI SEIKI CO., LTD. The sintered bodies had a size with a diameter of φ80 mm and a thickness of 6 mm. The rotational speed during processing was 140 rpm, the amount of cutting by the cutting tool was 0.3 mm, and the feed speed was 0.097 mm/rev. The used cutting tool (manufactured by MITSUBISHI MATERIALS CORPORATION) has a shape model number of STFER1616H16, an insert shape model number of TEGX160302L, and a material type of HTi10. Then, the surface having a thickness of 0.5 mm was cut from each sintered body to thereby evaluate the surface of the sintered body. Specifically, surface roughness measurement and confirmation of the presence/absence of chipping of the processed surface were performed at the position 20 mm apart from the central portion of the processed sintered body. Note that the surface roughness measuring device was surftest SV-3000 manufactured by Mitsutoyo and the evaluation length was 4 mm. The presence/absence of chipping was determined by taking a photograph in the area of 2 cm$^2$ using a low magnification optical microscope so as to determine the presence/absence of chipping having an inscribed circle-equivalent diameter of 0.3 mm or greater.

TABLE 1

CONTENT (at %) OF EACH METAL WITH RESPECT TO TOTAL AMOUNT OF METALS

| | Ga | Sb CONTENT | Na (ADDED AS NaF) | Na (ADDED AS Na$_2$S) | Na (ADDED AS Na$_2$Se) | Cu |
|---|---|---|---|---|---|---|
| EXAMPLE 1 | 20.0 | 0.30 | — | — | — | REMAINING |
| EXAMPLE 2 | 20.0 | 0.30 | — | — | — | REMAINING |
| EXAMPLE 3 | 20.0 | 0.30 | — | — | — | REMAINING |
| EXAMPLE 4 | 30.0 | 3.00 | — | — | — | REMAINING |
| EXAMPLE 5 | 30.0 | 0.10 | — | — | — | REMAINING |
| EXAMPLE 6 | 30.0 | 1.00 | — | — | — | REMAINING |
| EXAMPLE 7 | 35.0 | 1.00 | — | — | — | REMAINING |
| EXAMPLE 8 | 35.0 | 2.00 | — | — | — | REMAINING |
| EXAMPLE 9 | 35.0 | 3.00 | — | — | — | REMAINING |
| EXAMPLE 10 | 25.5 | 0.50 | — | — | — | REMAINING |
| EXAMPLE 11 | 25.5 | 0.50 | — | — | — | REMAINING |
| EXAMPLE 12 | 25.5 | 0.50 | — | — | — | REMAINING |
| EXAMPLE 13 | 30.2 | 0.50 | 0.50 | — | — | REMAINING |
| EXAMPLE 14 | 20.1 | 0.50 | 0.50 | — | — | REMAINING |
| EXAMPLE 15 | 35.2 | 0.50 | 0.50 | — | — | REMAINING |
| EXAMPLE 16 | 35.2 | 0.50 | 0.50 | — | — | REMAINING |
| EXAMPLE 17 | 35.1 | 0.50 | — | 0.50 | — | REMAINING |
| EXAMPLE 18 | 35.1 | 0.50 | — | — | 0.50 | REMAINING |

TABLE 2

CONTENT (at %) OF EACH METAL WITH RESPECT TO TOTAL AMOUNT OF METALS

| | Ga | Sb CONTENT | Na (ADDED AS NaF) | Na (ADDED AS Na$_2$S) | Na (ADDED AS Na$_2$Se) | Cu |
|---|---|---|---|---|---|---|
| COMPARATIVE EXAMPLE 1 | 25.0 | 0.00 | — | — | — | REMAINING |
| COMPARATIVE EXAMPLE 2 | 25.0 | 0.00 | — | — | — | REMAINING |
| COMPARATIVE EXAMPLE 3 | 25.0 | 0.00 | — | — | — | REMAINING |
| COMPARATIVE EXAMPLE 4 | 25.0 | 0.00 | — | — | — | REMAINING |
| COMPARATIVE EXAMPLE 5 | 30.0 | 0.02 | — | — | — | REMAINING |
| COMPARATIVE EXAMPLE 6 | 30.0 | 0.02 | — | — | — | REMAINING |
| COMPARATIVE EXAMPLE 7 | 30.0 | 0.02 | — | — | — | REMAINING |
| COMPARATIVE EXAMPLE 8 | 35.0 | 5.00 | — | — | — | REMAINING |
| COMPARATIVE EXAMPLE 9 | 20.2 | 5.05 | 1.01 | — | — | REMAINING |
| COMPARATIVE EXAMPLE 10 | 35.0 | 3.50 | — | — | — | REMAINING |
| COMPARATIVE EXAMPLE 11 | 35.0 | 3.50 | — | — | — | REMAINING |

TABLE 2-continued

| | CONTENT (at %) OF EACH METAL WITH RESPECT TO TOTAL AMOUNT OF METALS | | | | | |
|---|---|---|---|---|---|---|
| | Ga | Sb CONTENT | Na (ADDED AS NaF) | Na (ADDED AS $Na_2S$) | Na (ADDED AS $Na_2Se$) | Cu |
| COMPARATIVE EXAMPLE 12 | 35.2 | 0.00 | — | 1.01 | — | REMAINING |
| COMPARATIVE EXAMPLE 13 | 35.2 | 0.00 | — | — | 1.01 | REMAINING |

TABLE 3

| | SINTERING METHOD | PRESSURE ($kgf/cm^2$) PRESSURE DURING SINTERING FOR HP OR HIP METHOD PRESSING PRESSURE FOR PRESS MOLDING OR SINTERING METHOD | SINTERING TEMPERATURE (° C.) | SINTERING TIME (H) | TARGET DENSITY (%) |
|---|---|---|---|---|---|
| EXAMPLE 1 | HP | 300 | 650 | 2 | 97 |
| EXAMPLE 2 | HIP | 800 | 600 | 1 | 99 |
| EXAMPLE 3 | PRESS MOLDING SINTERING | 1200 | 650 | 2 | 97 |
| EXAMPLE 4 | HP | 300 | 630 | 2 | 95 |
| EXAMPLE 5 | HIP | 800 | 590 | 2 | 98 |
| EXAMPLE 6 | HP | 350 | 630 | 2 | 97 |
| EXAMPLE 7 | HP | 300 | 560 | 2 | 95 |
| EXAMPLE 8 | HIP | 700 | 500 | 1 | 99 |
| EXAMPLE 9 | PRESS MOLDING SINTERING | 1500 | 620 | 3 | 96 |
| EXAMPLE 10 | HP | 250 | 650 | 2 | 98 |
| EXAMPLE 11 | HIP | 1000 | 600 | 1 | 99 |
| EXAMPLE 12 | PRESS MOLDING SINTERING | 1300 | 825 | 3 | 96 |
| EXAMPLE 13 | PRESS MOLDING SINTERING | 1000 | 650 | 4 | 97 |
| EXAMPLE 14 | HIP | 1200 | 600 | 2 | 98 |
| EXAMPLE 15 | HP | 350 | 550 | 2 | 96 |
| EXAMPLE 16 | HP | 250 | 560 | 3 | 97 |
| EXAMPLE 17 | HP | 300 | 560 | 3 | 98 |
| EXAMPLE 18 | HP | 300 | 550 | 3 | 98 |

TABLE 4

| | SINTERING METHOD | PRESSURE ($kgf/cm^2$) PRESSURE DURING SINTERING FOR HP OR HIP METHOD PRESSING PRESSURE FOR PRESS MOLDING OR SINTERING METHOD | SINTERING TEMPERATURE (° C.) | SINTERING TIME (H) | TARGET DENSITY (%) |
|---|---|---|---|---|---|
| COMPARATIVE EXAMPLE 1 | HP | 400 | 700 | 2 | 97 |
| COMPARATIVE EXAMPLE 2 | HIP | 1000 | 650 | 1 | 98 |
| COMPARATIVE EXAMPLE 3 | PRESS MOLDING SINTERING | 800 | 880 | 5 | 97 |
| COMPARATIVE EXAMPLE 4 | CASTING ROLLING METHOD | — | — | — | 100 |
| COMPARATIVE EXAMPLE 5 | HP | 300 | 630 | 2 | 95 |
| COMPARATIVE EXAMPLE 6 | HIP | 800 | 590 | 1 | 98 |
| COMPARATIVE EXAMPLE 7 | CASTING ROLLING METHOD | — | — | — | INGOT CRACKED DURING ROLLING |
| COMPARATIVE EXAMPLE 8 | HP | 300 | 560 | 2 | 97 |
| COMPARATIVE EXAMPLE 9 | HP | 200 | 650 | 1 | 94 |
| COMPARATIVE EXAMPLE 10 | HIP | 700 | 560 | 1 | (*) |
| COMPARATIVE EXAMPLE 11 | HP | 350 | 580 | 1 | 98 |

TABLE 4-continued

| | SINTERING METHOD | PRESSURE (kgf/cm²) PRESSURE DURING SINTERING FOR HP OR HIP METHOD PRESSING PRESSURE FOR PRESS MOLDING OR SINTERING METHOD | SINTERING TEMPERATURE (° C.) | SINTERING TIME (H) | TARGET DENSITY (%) |
|---|---|---|---|---|---|
| COMPARATIVE EXAMPLE 12 | HP | 350 | 610 | 2 | 95 |
| COMPARATIVE EXAMPLE 13 | HP | 350 | 610 | 2 | 94 |

(*) NO EVALUATION BECAUSE Ga IN SINTERED BODY WAS ELUTED AND Ga DISTRIBUTION WAS SIGNIFICANTLY NONUNIFORM

TABLE 5

| | PHASE DETECTION BY XRD | | METAL CONTENT (at %) BY ICP ANALYSIS | | | PRESENCE/ ABSENCE OF INTERVENING Sb PHASE IN AREA OF 200-150 μm | NUMBER OF INTERVENING Sb PHASES HAVING GRAIN DIAMETER OF 0.5 μm OR GREATER IN AREA OF 200-150 μm | PRESENCE/ ABSENCE OF CHIPPING AFTER PROCESSING | SURFACE ROUGH- NESS Ra(μm) | SURFACE ROUGH- NESS Rz(μm) |
|---|---|---|---|---|---|---|---|---|---|---|
| | Ga PHASE | CuGa PHASE | Ga | Sb | Na | | | | | |
| EXAMPLE 1 | NO | YES | 19.0 | 0.2 | — | PRESENCE | 50 | ABSENCE | 0.4 | 4.1 |
| EXAMPLE 2 | NO | YES | 19.0 | 0.3 | — | PRESENCE | 60 | ABSENCE | 0.3 | 3.2 |
| EXAMPLE 3 | NO | YES | 20.0 | 0.3 | — | PRESENCE | 30 | ABSENCE | 0.5 | 5 |
| EXAMPLE 4 | NO | YES | 31.0 | 2.9 | — | PRESENCE | 200 | ABSENCE | 0.3 | 3.5 |
| EXAMPLE 5 | NO | YES | 29.0 | 0.1 | — | PRESENCE | 8 | ABSENCE | 0.65 | 8.1 |
| EXAMPLE 6 | NO | YES | 30.0 | 1.1 | — | PRESENCE | 164 | ABSENCE | 0.61 | 5.1 |
| EXAMPLE 7 | NO | YES | 34.0 | 0.9 | — | PRESENCE | 100 | ABSENCE | 0.65 | 5.4 |
| EXAMPLE 8 | NO | YES | 34.0 | 2.1 | — | PRESENCE | 121 | ABSENCE | 0.61 | 5.2 |
| EXAMPLE 9 | NO | YES | 35.0 | 2.9 | — | PRESENCE | 65 | ABSENCE | 0.77 | 6.2 |
| EXAMPLE 10 | NO | YES | 25.5 | 0.4 | — | PRESENCE | 90 | ABSENCE | 0.5 | 5.7 |
| EXAMPLE 11 | NO | YES | 25.3 | 0.5 | — | PRESENCE | 90 | ABSENCE | 0.71 | 7.5 |
| EXAMPLE 12 | NO | YES | 25.4 | 0.4 | — | PRESENCE | 80 | ABSENCE | 0.64 | 6.3 |
| EXAMPLE 13 | NO | YES | 29.5 | 0.5 | 0.4 | PRESENCE | 100 | ABSENCE | 0.73 | 7.8 |
| EXAMPLE 14 | NO | YES | 20.6 | 0.4 | 0.6 | PRESENCE | 96 | ABSENCE | 0.77 | 8.1 |
| EXAMPLE 15 | NO | YES | 34.5 | 0.4 | 0.4 | PRESENCE | 94 | ABSENCE | 0.76 | 7.9 |
| EXAMPLE 16 | NO | YES | 34.8 | 0.5 | 0.5 | PRESENCE | 97 | ABSENCE | 0.68 | 7.2 |
| EXAMPLE 17 | NO | YES | 35.2 | 0.5 | 0.4 | PRESENCE | 85 | ABSENCE | 0.7 | 7.1 |
| EXAMPLE 18 | NO | YES | 35.0 | 0.4 | 0.5 | PRESENCE | 82 | ABSENCE | 0.69 | 7.1 |

TABLE 6

| | PHASE DETECTION BY XRD | | METAL CONTENT (at %) BY ICP ANALYSIS | | | PRESENCE/ ABSENCE OF INTERVENING Sb PHASE IN AREA OF 200-150 μm | NUMBER OF INTERVENING Sb PHASES HAVING GRAIN DIAMETER OF 0.5 μm OR GREATER IN AREA OF 200-150 μm | PRESENCE/ ABSENCE OF CHIPPING AFTER PROCESSING | SURFACE ROUGH- NESS Ra(μm) | SURFACE ROUGH- NESS Rz(μm) |
|---|---|---|---|---|---|---|---|---|---|---|
| | Ga PHASE | CuGa PHASE | Ga | Sb | Na | | | | | |
| COMPARATIVE EXAMPLE 1 | NO | YES | 24.8 | 0 | — | ABSENCE | NONE | PRESENCE | 1.5 | 10.1 |
| COMPARATIVE EXAMPLE 2 | NO | YES | 25.1 | 0 | — | ABSENCE | NONE | PRESENCE | 1.9 | 12.3 |
| COMPARATIVE EXAMPLE 3 | NO | YES | 25.0 | 0 | — | ABSENCE | NONE | PRESENCE | 1.2 | 11 |
| COMPARATIVE EXAMPLE 4 | NO | YES | 24.9 | 0 | — | ABSENCE | NONE | PRESENCE | 2.4 | 30.2 |
| COMPARATIVE EXAMPLE 5 | NO | YES | 29.7 | 0.01 | — | PRESENCE | 1 | PRESENCE | 2.1 | 13.1 |
| COMPARATIVE EXAMPLE 6 | NO | YES | 30.1 | 0.02 | — | PRESENCE | 1 | PRESENCE | 1.8 | 14.1 |
| COMPARATIVE EXAMPLE 7 | NO | YES | 29.8 | 0.01 | — | PRESENCE | 1 | EVALUATION INTERRUPTED BECAUSE OF CRACKING DURING PROCESSING | | |
| COMPARATIVE EXAMPLE 8 | NO | YES | 34.8 | 4.9 | — | PRESENCE | 732 | EVALUATION INTERRUPTED BECAUSE OF CHIPPING DURING SURFACE PROCESSING | | |

TABLE 6-continued

| | PHASE DETECTION BY XRD | | METAL CONTENT (at %) BY ICP ANALYSIS | | | PRESENCE/ ABSENCE OF INTERVENING Sb PHASE IN AREA OF 200-150 μm | NUMBER OF INTERVENING Sb PHASES HAVING GRAIN DIAMETER OF 0.5 μm OR GREATER IN AREA OF 200-150 μm | PRESENCE/ ABSENCE OF CHIPPING AFTER PROCESSING | SURFACE ROUGH- NESS Ra(μm) | SURFACE ROUGH- NESS Rz(μm) |
|---|---|---|---|---|---|---|---|---|---|---|
| | Ga PHASE | CuGa PHASE | Ga | Sb | Na | | | | | |
| COMPARATIVE EXAMPLE 9 | NO | YES | 20.1 | 5.1 | 0.9 | PRESENCE | 841 | EVALUATION INTERRUPTED BECAUSE OF CHIPPING DURING SURFACE PROCESSING | | |
| COMPARATIVE EXAMPLE 10 | YES | YES | 35.0 | 3.6 | — | PRESENCE | NO EVALUATION BECAUSE OF NONUNIFORM STRUCTURE | | | |
| COMPARATIVE EXAMPLE 11 | YES | YES | 35.2 | 3.5 | — | PRESENCE | 260 | EVALUATION INTERRUPTED BECAUSE OF CHIPPING DURING SURFACE PROCESSING | | |
| COMPARATIVE EXAMPLE 12 | NO | YES | 35.1 | 0 | 1.1 | ABSENCE | NONE | PRESENCE | 3.1 | 11.5 |
| COMPARATIVE EXAMPLE 13 | NO | YES | 35.1 | 0 | 0.8 | ABSENCE | NONE | PRESENCE | 2.9 | 11.8 |

Figure 2:
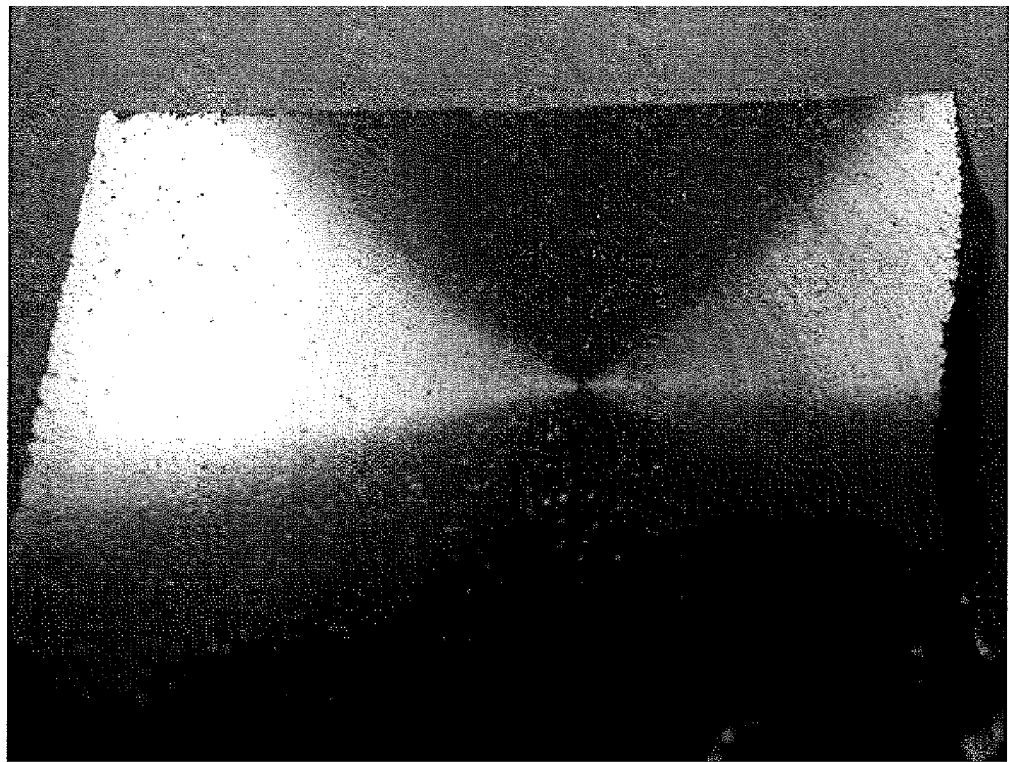
FIG. 2 is a photograph illustrating the processed target surface in Comparative Example of the sputtering target and the method for producing the same according to the present invention.

As can be seen from these evaluation results, in Comparative Examples 1 to 7 and Comparative Examples 12 and 13 in which Sb is not added or the amount of Sb added is less than the content of Sb in the present invention, chipping after processing occurred in multiple locations the surface roughness Ra was 1.2 or greater and the surface roughness Rz was 10.1 or greater, whereas in Examples 1 to 5 of the present invention in which the effective amount of Sb is added, no chipping occurred after processing, the surface roughness Ra was 0.85 or lower, and the surface roughness Rz was 8.1 or lower, resulting in obtaining excellent machinability. As an example, the photographs of the processed target surfaces in Example of the present invention in which the composition of Cu, Ga, and Sb was $Cu_{69}Ga_{30}Sb_1$ (at %) and in Comparative Example of the present invention in which the composition of Cu, Ga, and Sb was $Cu_{69.9}Ga_{30}Sb_{0.01}$ (at %) are shown in FIG. 1 and FIG. 2.

Figure 3:
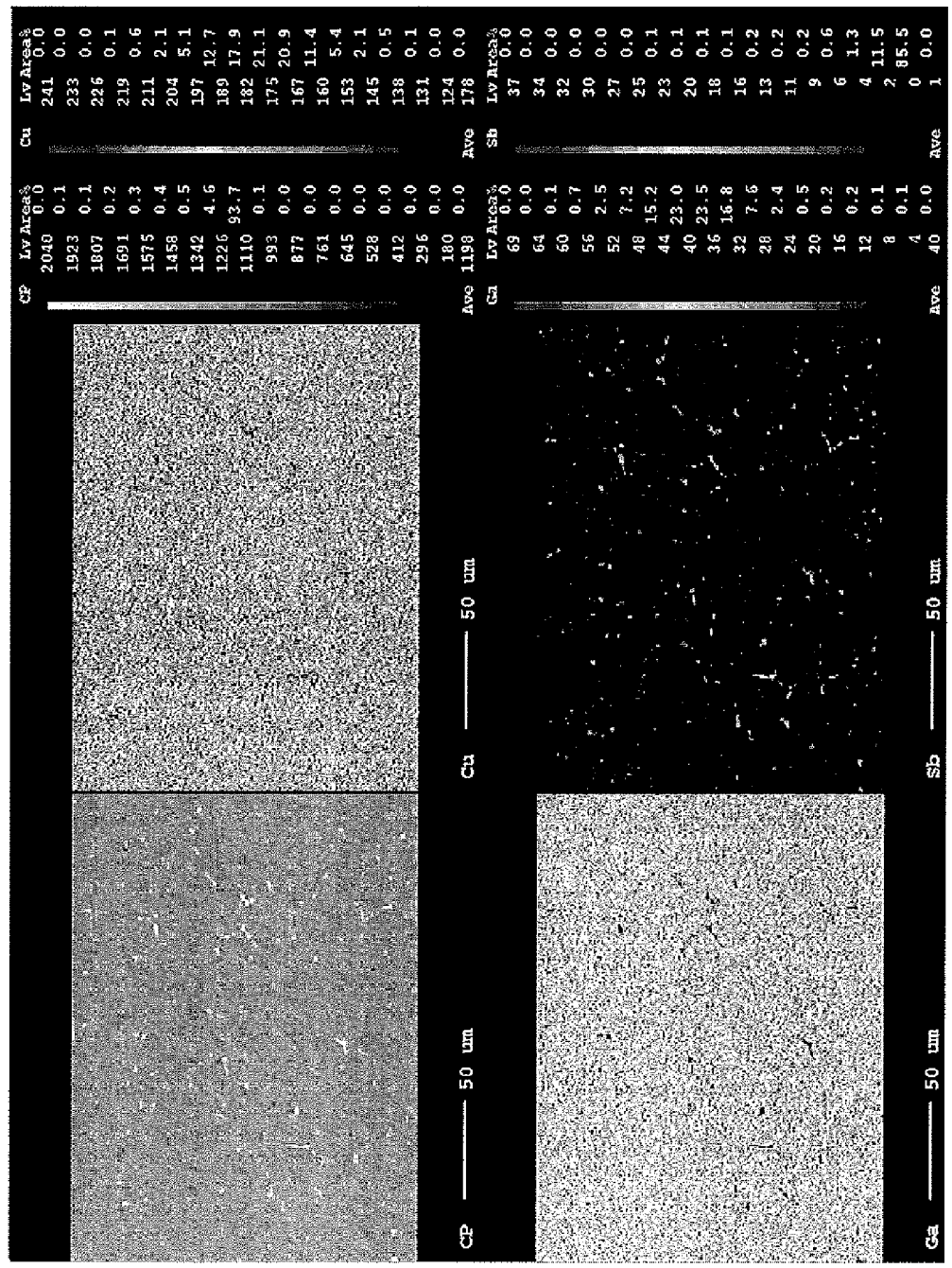
FIG. 3 is a photograph illustrating a component image (COMP image), a Cu element mapping image, a Ga element mapping image, and a Sb element mapping image obtained by an electron-probe micro analyzer (EPMA) in Example of the present invention.

As can be seen from structure observation results, the number of intervening Sb phases in any one of Examples 1 to 18 of the present invention was six or greater, resulting in a distribution of Sb in the structure. As an example, element distribution mapping images, which were obtained by EPMA, in Example of the present invention in which the composition of Cu, Ga, and Sb was $Cu_{64}Ga_{35}Sb_1$ (at %) were shown in FIG. 3. All of the original images of these EPMA images were color images but were converted into monochromatic images by gray scale. The content of Cu, Ga, and Sb tends to be high as the brightness increases.

Note that the obtained targets had a high density of 95% or greater in all of Examples of the present invention.

The technical scope of the present invention is not limited to the aforementioned embodiments and Examples, but the present invention may be modified in various ways without departing from the scope or teaching of the present invention.

What is claimed is:

1. A sputtering target having a component composition containing 20 to 40 at % of Ga, 0.1 to 3 at % of Sb, and the balance composed of Cu and unavoidable impurities.

2. The sputtering target according to claim 1, wherein the sputtering target has a structure including at least one of a Sb simple substance or a compound including Sb and Cu within crystal grains or grain boundaries of an alloy phase mainly containing a Cu—Ga alloy.

3. The sputtering target according to claim 1, wherein Ga in the sputtering target material is contained in the form of a Cu—Ga binary alloy.

4. The sputtering target according to claim 1, wherein Na is contained as an NaF compound, an $Na_2S$ compound, or an $Na_2Se$ compound and Na is contained in 0.05 to 2 at % with respect to all metal elements in the sputtering target.

5. A method for producing the sputtering target according to claim 1, the method comprising:
   a step of producing a starting material powder that is obtained by pulverizing at least Cu, Ga and Sb as simple substances or an alloy that contains two or more of these elements; and
   a step of subjecting the starting material powder to hot processing in a vacuum, in an inert atmosphere or in a reducing atmosphere,
   wherein Ga is contained in the starting material powder in the form of a Cu—Ga alloy or in the form of a Ga—Sb alloy.

6. A method for producing the sputtering target according to claim 4, the method comprising:
   a step of producing a starting material powder that is obtained by preparing at least Cu, Ga and Sb as simple substances or an alloy that contains two or more of these elements as metal powder and mixing the metal powder with NaF powder, $Na_2S$ powder, or $Na_2Se$ powder; and
   a step of subjecting the starting material powder to hot processing in a vacuum, in an inert atmosphere or in a reducing atmosphere,
   wherein Ga is contained in the starting material powder in the form of a Cu—Ga alloy or in the form of a Ga—Sb alloy.

* * * * *